US006872319B2

(12) United States Patent
Tsai (10) Patent No.: US 6,872,319 B2
(45) Date of Patent: Mar. 29, 2005

(54) PROCESS FOR HIGH YIELD FABRICATION OF MEMS DEVICES

(75) Inventor: Chialun Tsai, Thousand Oaks, CA (US)

(73) Assignee: Rockwell Scientific Licensing, LLC, Thousand Oaks, CA (US)

( * ) Notice: Subject to any disclaimer, the term of this patent is extended or adjusted under 35 U.S.C. 154(b) by 368 days.

(21) Appl. No.: 10/260,250

(22) Filed: Sep. 30, 2002

(65) Prior Publication Data

US 2004/0060898 A1 Apr. 1, 2004

(51) Int. Cl.[7] .......................... H01L 21/027; B81C 3/00
(52) U.S. Cl. .............................. 216/2; 216/24; 216/33; 216/36; 216/40; 216/41; 216/49; 216/67; 438/29
(58) Field of Search ..................... 216/2, 24, 33–36, 216/40–41, 49, 67; 438/29

(56) References Cited

U.S. PATENT DOCUMENTS

| | | | |
|---|---|---|---|
| 5,996,221 A | * | 12/1999 | Chirovsky et al. ............ 29/840 |
| 6,533,947 B2 | * | 3/2003 | Nasiri et al. ................... 216/2 |
| 6,686,639 B1 | * | 2/2004 | Tsai ........................... 257/415 |
| 6,758,983 B2 | * | 7/2004 | Conant et al. ................ 216/2 |
| 2003/0039021 A1 | * | 2/2003 | Ton ............................. 359/290 |
| 2003/0111441 A1 | * | 6/2003 | Jerominek et al. ............ 216/39 |

OTHER PUBLICATIONS

Hiller, K. et al "Low temperature approaches for fabrication of high frequency microscanners" SPIE vol. 3878, Sep. 1999, pp 58–66.*

* cited by examiner

Primary Examiner—Anita Alanko (57) ABSTRACT

A MEMS fabrication process eliminates through-wafer etching, minimizes the thickness of silicon device layers and the required etch times, provides exceptionally precise layer to layer alignment, does not require a wet etch to release the moveable device structure, employs a supporting substrate having no device features on one side, and utilizes low-temperature metal-metal bonding which is relatively insensitive to environmental particulates. This process provided almost 100% yield of scanning micromirror devices exhibiting scanning over a 12° optical range and a mechanical angle of ±3° at a high resonant frequency of 2.5 kHz with an operating voltage of only 20 VDC.

30 Claims, 4 Drawing Sheets

PROCESS FOR HIGH YIELD FABRICATION OF MEMS DEVICES

CROSS-REFERENCE TO RELATED APPLICATIONS

This application is related to an application of Chialun Tsai entitled "High-Performance MEMS Device Fabricatable with High Yield", which is being filed on the same date as this application and is assigned to the same assignee, now U.S. Pat. No. 6,689,639.

BACKGROUND OF THE INVENTION

1. Field of the Invention

This invention is concerned with micro-electro-mechanical systems (MEMS) and in particular with processes for fabricating MEMS devices.

2. Description of the Related Art

Micro-electro-mechanical systems (MEMS) fabricated from single crystal silicon by anisotropic etching are widely used for sensors (accelerometers, for example) and are of increasing commercial interest and importance for use in a variety of active devices, such as electrical switches, variable capacitors and inductors, and micromirrors for optical scanning and switching. A typical MEMS active device comprises a functional element that is anchored by a spring or hinge but suspended above a substrate so that it can be moved by an actuator, such as a capacitively driven comb structure. The moveable functional element might be a switch contact, capacitor plate or micromirror, for example. In addition to the small size desirable for portable equipment, MEMS devices offer the potential for faster response times, lower power consumption and reduced costs. Large cost benefits can be provided if the yield of functional devices per processed wafer is high.

An important potential application for MEMS is scanning mirrors, which are used in a wide variety of measurement and communications equipment including barcode readers, laser printers, confocal microscopes and fiber-optic networks. Compared to macro-scale scanning mirrors, MEMS micromirrors offer faster scanning speed, lower power consumption and reduced cost, and are enabling with respect to many new technologies. In particular, scanning micromirrors with high frequency optical switching capability are critical to development of advanced telecommunications systems.

The state of the prior art for MEMS wafer processing is illustrated by the fabrication process for a micromirror device with a comb actuator structure described in a recent publication (R. A. Conant, J. T. Lee, N. Y. Lau and R. S. Muller, p. 6, Proc. Solid-State and Actuator Workshop, Hilton Head Island, S.C., Jun. 4–8, 2000). For this device, one silicon layer comprises a coplanar circular mirror (550 $\mu$m diameter) and a moveable comb actuator suspended via a silicon torsion spring, which is connected to a stationary anchor. A second silicon device layer comprises a stationary comb structure whose teeth are immediately below the spaces between the teeth in the moveable comb. Capacitive charging of the teeth on the two combs by an applied voltage produces a force of attraction that tends to move the moveable comb and the attached micromirror, which are returned to their original positions by the torsion spring when the voltage is removed. The major steps in the prior art process for fabricating this mircromirror are as follows:

(1) A thermal oxide layer (0.2 $\mu$m thick) on a first silicon wafer is patterned via photoresist imaging and the exposed oxide and the underlying silicon layer are etched in a deep reactive ion etcher to form trenches (100 $\mu$m deep) that define the fixed comb teeth of the actuator. This silicon layer must be relatively thick since it serves as both the mechanical support and electrical connection for the finished device.

(2) The oxide layer on the comb teeth on the first silicon wafer is bonded to a thermal oxide layer (1.5 $\mu$m thick) on a second silicon wafer, which buries the fixed comb and mirror structure, and the bonded wafer pair is annealed (1100° C.) to increase the bond strength.

(3) The silicon layer above the oxide layer on the second wafer is then reduced to a thickness of 50 $\mu$m by grinding and polishing.

(4) The resulting silicon-on-insulator (SOI) wafer with the buried fixed comb structure is subjected to steam at 1100° C. to form an oxide layer (1.1 $\mu$m thick) on both outer silicon surfaces.

(5) Small windows are etched in the 50-$\mu$m silicon layer to expose two sacrificial buried comb structures, which are used to align masks for subsequent patterning.

(6) The oxide on the 50-$\mu$m silicon layer is patterned and etched to form the etch mask for the silicon mirror and moveable comb structure.

(7) The oxide on the thick silicon layer is patterned and the oxide and underlying thick silicon are etched to form a hole that serves as the optical path to the micromirror.

(8) The 50-$\mu$m silicon layer is etched to form the micromirror and moveable comb actuator structure.

(9) The moveable mirror-comb structure is released via a timed wet chemical etch, typically hydrofluoric acid (HF) or buffered oxide etch (BOE), which removes the oxide layer between the moveable and stationary structures.

(10) An aluminum film is evaporated onto the micromirror to increase its reflectivity.

This process for fabricating scanning micromirror devices, which is typical of the prior art for MEMS device fabrication, has several important disadvantages. In particular, the silicon-oxide-silicon bonding process requires temperatures in excess of 1000° C. and is very sensitive to particulates so that the wafers must be handled in at least a Class 10 cleanroom environment. Another significant disadvantage is that the through-wafer etching procedure used to open the optical path and provide access for removing the internal oxide layer greatly increases the processing time (3–5 hours), reduces the etching accuracy and device yield, and requires use of thicker photoresist with reduced feature resolution. The device yield is further reduced by the wet HF or BOE etching procedure required to remove the internal oxide layer and release the moveable parts of the device. This wet chemical etching procedure is difficult to control and is another major source of yield loss. In addition, the presence of deep etched features on both sides of the device complicates photolithographic processing and increases the likelihood of damage during handling. Also, use of the stationary comb silicon layer as one of the electrical connections limits options for device integration and in some cases may necessitate extra processing to electrically ground or connect floating elements. Furthermore, lack of precise alignment between the stationary and moveable comb structures for prior art processes further reduces the device yield and necessitates use of excessively high actuator voltages. Although typical of the prior art MEMS fabrication processes, all of these disadvantages may not apply equally to every device and every fabrication process.

SUMMARY OF THE INVENTION

The present invention provides a MEMS fabrication process that minimizes the thickness of the silicon device layers and the required etch times, provides exceptionally precise layer to layer alignment of the device components, does not require a wet etch to release the moveable device structure, employs a supporting substrate having no device features on one side, and utilizes low-temperature metal-metal bonding which is also less sensitive to environmental particulates than high temperature silicon-silicon oxide bonding. The process of the present invention can be used to fabricate a wide variety of MEMS devices, including sensors, but is particularly useful for fabrication of active MEMS devices (for example, electrical switches, variable capacitors and inductors, high frequency resonators, and mircromirrors for optical scanning and switching), which are often difficult to fabricate with high yield using prior art processes. Active MEMS devices typically use an electrostatic comb actuator but the process of the present invention could also be used to fabricate devices employing other types of actuators.

The basic steps of a preferred embodiment of the process of the present invention for fabrication of an active MEMS device are as follows. Alignment marks are etched into the surface of the first silicon device layer on a first silicon-on-insulator (SOI) wafer, which comprises a first etch stop layer (e.g., silicon oxide) sandwiched between the first silicon device layer and a supporting substrate (e.g., silicon). An etch resistant layer (e.g., silicon oxide) is applied to the first silicon device layer and is patterned and etched to expose silicon in predetermined contact and bond pad areas, which are selectively metallized by deposition of a metal layer (e.g., Cr/Au) and liftoff of the remaining photoresist and extraneous metal. The etch resistant layer is then patterned again and etched (preferably by dry oxide plasma etching) and the underlying silicon is etched (preferably by deep silicon plasma etching) to form the stationary actuator structure, which is protected from subsequent etching by the remaining etch resistant layer. Metallic contact pads spatially mated to those on the first device layer are formed on a second silicon device layer on a second SOI wafer, which comprises a second etch stop layer (e.g., silicon oxide) sandwiched between the second device layer and a handle substrate (e.g., silicon). The mating bond pads on the two wafers are aligned and bonded together by thermal compression bonding and the handle substrate and etch stop layer on the second wafer are removed. The overall thickness of the bonded metallization layers determines the vertical spacing between the stationary and moveable actuator structures. Small areas on the second device layer are patterned and removed to expose at least two alignment marks on the first device layer, which are used for precise alignment of the mask for patterning the second device layer. The second device layer is patterned and etched to form the moveable actuator structure and functional device element, which are connected via a silicon spring to stationary silicon pads that serve as mechanical supports and electrical contacts. Electrical contacts are formed to the contact pads, by wire bonding, for example.

Micromirror devices fabricated by the process of the present invention exhibited scanning over a 12° optical range and a mechanical angle of $\pm 3°$ at a high resonant frequency of 2.5 kHz with an operating voltage of only 20 VDC, and were processed with practically 100% yield. Comparable MEMS scanning micromirror devices fabricated with a prior art process required more than 100 V for switching and were obtained in less than 20% yield.

Key features of the present invention that contribute to high device performance, reduced processing time and high process yield are relatively thin silicon device layers (20–50 $\mu$m), no through-wafer etch procedure, low-temperature metal-metal thermal compression bonding for inter-layer connections, high precision alignment between device layers, and self release during formation of the moveable device structure. Elimination of the through-wafer etch procedure, enabled by use of a supporting substrate, reduces etch times from 3–5 hours for prior art procedures to 20–30 minutes, which increases throughput and reduces costs. Shorter etch times also increase the accuracy of the etch procedure and enable use of thinner photoresists, which increases the resolution of the photolithographic process. The relatively low temperature for thermal compression bonding of Au—Au bond pads (around 330° C.) minimizes stress and deformation of the actuator structures. The metal-metal bonding procedure also ensures proper electrical connections and is less sensitive to particulates, which enables bonding to be performed in a relatively inexpensive cleanroom (Class 1000, for example). High precision alignment between device layers is provided by use of alignment marks on the first device layer. The self release provided by the present invention avoids the wet chemical oxide etch, which is a primary cause of reduced device yield for prior art processes. In addition, the supporting substrate and one-sided processing of the present invention minimizes the possibility of incidental damage to devices during fabrication, handling and packaging.

Further features and advantages of the invention will be apparent to those skilled in the art from the following detailed description, taken together with the accompanying drawings.

BRIEF DESCRIPTION OF THE DRAWINGS

These figures are not to scale and some features have been enlarged for better depiction.

DETAILED DESCRIPTION OF THE INVENTION

Terminology used in this document is generally the same as that used in the art. Patterning typically involves applying a thin layer of photoresist, exposing the photoresist to radiation through a mask having a predetermined pattern, and dissolving the uncured photoresist in a solvent so as to permit removal of the underlying substrate material, usually by etching. The photoresist may be negative (cured by exposure to radiation) or positive (degraded by exposure to radiation), and may be applied as a liquid by spraying, dipping or spin coating, for example, or as a dry film. As known to those skilled in the art, MEMS fabrication typically involves anisotropic etching of single crystal silicon wafers using silicon oxide as an etch stop, or as an etch resistant layer to prevent etching of underlying silicon. Silicon etching may be performed by wet chemical methods or dry methods (plasma etching, for example). Depending on the etching conditions, silicon or silicon oxide may be selectively removed. A handle substrate imparts sufficient structural integrity to a silicon device layer for ease of handling and is ultimately removed. Handle substrates are typically silicon attached to the device layer via a silicon oxide layer, which serves as an etch stop during removal of the handle substrate.

Figure 1:
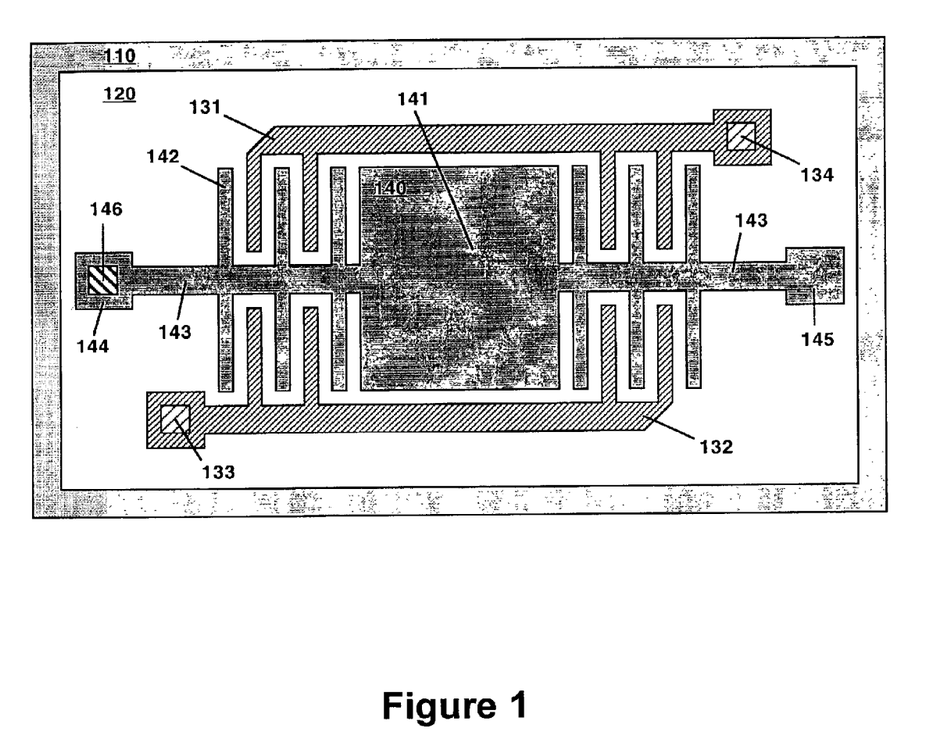
FIG. 1 is a schematic overhead view of a micromirror device of a type that may be fabricated by the process of the present invention.

FIG. 1 illustrates schematically a type of micromirror device that may be fabricated by the process of the present invention. Each kind of shading represents a different layer of the device. Layer 110 is a supporting substrate that is preferably a continuous layer of silicon but may be discontinuous or comprised of another material, which may be an insulator, conductor or semiconductor. Layer 120 is preferably silicon oxide but may be another material of sufficient resistivity to provide substantial electrical isolation between the stationary comb structures 131 and 132, which are disposed in a first device layer upon insulating layer 120 and are electrically contacted separately. Electrical contacts to comb structures 131 and 132 are preferably made via wire bonds to metallic contact pads 133 and 134, respectively, but may be made by any suitable method. Layer 140 is a second device layer comprised of silicon patterned to form micromirror 141, comb teeth 142, torsion spring 143, and stationary pads 144 and 145. Micromirror 141, comb teeth 142 and torsion spring 143 comprise the moveable device structure which is supported by mating pads (not shown), underneath pads 144 and 145, in the first device layer. Pads 144 and 145 are preferably bonded to the mating pads in the first device layer by metal but are electrically isolated from stationary comb structures 131 and 132 via the portion of insulating layer 120 interposed between the mating pads in the first device layer and substrate 110. Electrical contact to the mirror-comb structure in device layer 140 is established via contact pad 146, which preferably comprises a metal. A voltage applied between contact pad 144 and contact pad 133 or 134 produces an attractive force between moveable comb teeth 142 and the teeth of stationary comb 131 or 132, respectively, that tends to cause micromirror 141 to rotate about the axis of torsion spring 143. When a voltage is not applied, spring 143 tends to return micromirror 141 to its original position.

Figure 2:
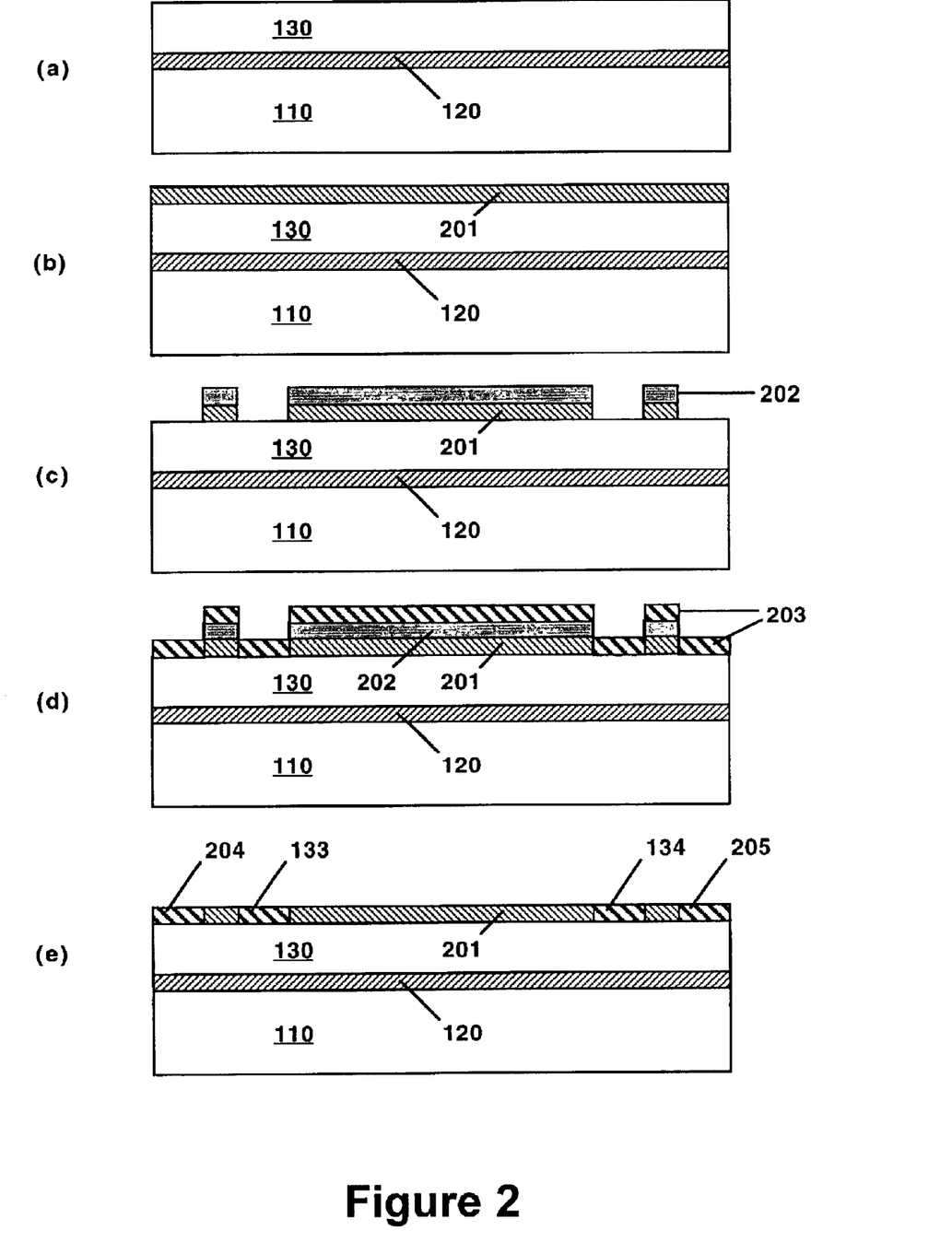
FIG. 2 illustrates schematically the basic steps in the process of the present invention and includes a schematic side view of a micromirror device that may be fabricated by this process.

FIG. 2 illustrates, using fabrication of the scanning micromirror device of FIG. 1 as an example, the basic steps in a preferred embodiment of the process of the present invention. As depicted in FIG. 2(a), a first silicon-on-insulator (SOI) wafer is provided, said wafer comprising a first etch stop layer 120 sandwiched between a first silicon device layer 130 and a supporting substrate 110. The thickness of silicon device layer 130 is preferably 50 $\mu$m for a scanning micromirror device but may vary significantly depending on the type and desired characteristics of the MEMS device fabricated. Etch stop layer 120 preferably comprises silicon oxide but other electrically insulating materials could be used. Supporting substrate 110 preferably comprises silicon of sufficient thickness to provide mechanical support to the device layers but a wide variety of insulating or conducting materials could be used. Alignment marks (not shown), typically comprising a cross-hair structure, are provided on silicon layer 130, preferably by patterning and etching.

As depicted in FIG. 2(b), an etch resistant layer 201 is applied to first silicon device layer 130. Layer 201 is preferably 2500 Å of silicon oxide applied by plasma enhanced chemical vapor deposition (PECVD) but could be a different etch resistant material, a different thickness, or applied by another method.

As depicted in FIG. 2(c), etch resistant layer 201 is patterned with pattern layer 202 and selectively etched to expose silicon layer 130 in predetermined contact and bond pad areas. Pattern layer 202 is typically photoresist but could be a different type of mask.

As depicted in FIG. 2(d), a metal layer 203 is deposited on pattern layer 202 and the exposed areas of device layer 130. The alignment marks on first device layer 130 may be masked by pattern layer 202 so that they do not become obscured by metal layer 203. Metal layer 203 preferably comprises an underlayer (adhesion layer) of chromium to provide good adhesion and an overlayer of gold, which can be thermal compression bonded at low temperatures. Suitable thicknesses for the chromium and gold layers are 150 Å and 5000 Å, respectively, but other thicknesses may be used. Other metals (titanium, nickel or cobalt, for example) may be used as adhesion layers. For some adhesion layer metals (titanium, for example), a diffusion barrier layer of another metal (platinum, for example) may be needed. Metal layer 203 or component layers thereof may be applied by vacuum evaporation, sputtering, electroplating, electroless plating or other suitable method or combination of methods.

As depicted in FIG. 2(e), pattern layer 202 and the portion of metal layer 203 thereon are lifted off to form bond pads 204 and 205 and electrical contact pads 133 and 134. Liftoff of a photoresist pattern typically involves exposure to an organic solvent.

Etch resistant layer 201 is then patterned again, as indicated by pattern layer 210 in FIG. 2(f), and etched, and the underlying silicon is etched to form stationary actuator structures 131 and 132 and bond pad structures 204 and 205, as depicted in FIG. 2(g). The shaded areas on actuator structures 131 and 132 in FIG. 2 represent different cross-sectional planes compared to stationary comb teeth 235 (see FIG. 1). Etching of etch resistant layer 201, when comprised of silicon oxide, is preferably performed by dry oxide plasma etching and etching of the underlying silicon is preferably performed by deep silicon plasma etching, but other methods could be used. If metallization layer 203 in FIG. 2(d) is sufficiently resistant to the silicon etching procedure used, which is generally the case, it is not essential that pattern layer 210 cover metal pads 133, 134, 204 and 205.

In an alternative embodiment, metal layer 203 is patterned so as to provide etch protection for the silicon stationary comb structure so that application and patterning of pattern layer 210 is unnecessary.

Actuator structures 131 and 132 comprise electrically interconnected comb teeth 235 and metallized electrical contact pads 133 and 134, respectively. For the device of FIG. 1, structures 131, 132, 135 and 136 in FIG. 2(g) must be electrically isolated from one another but comb teeth within each of structures 131 and 132 must be electrically interconnected. This is readily accomplished by making the spacing between teeth 235 substantially smaller than the spacings between structures 131, 132, 135 and 136 so that the etch rate for the silicon between teeth 235 is slower. In this case, the etch process can be timed so that silicon in layer 130 is completely removed between structures 131, 132, 135 and 136 but not between comb teeth 235. Remaining portions of etch resistant layer 201 protects comb teeth 235 during subsequent silicon etching procedures. Etch resistant layer 201 is typically comprised of silicon oxide but could be a metal in alternative embodiments.

As depicted in FIG. 2(h), metallic bond pads 214 and 215, spatially mated to respective bond pads 204 and 205 on the first silicon device layer depicted in FIG. 2(g), are formed on a second silicon device layer 140. Bond pads 214 and 215 are preferably comprised Cr/Au layers but other metallization layers may be used. Other metals (titanium, nickel or cobalt, for example) may be used as adhesion layers. Suitable thicknesses for the chromium and gold layers are 150 Å and 5000 Å, respectively. As depicted in FIG. 2(h), a second SOI wafer, comprising a second etch stop layer 250 sandwiched between silicon layer 140 and a handle substrate 260, is typically employed to provide mechanical support to layer 140 during processing. Preferably, etch stop layer 250 is comprised of silicon oxide and handle substrate 260 is comprised of silicon. Use of handle substrate 260 and etch stop layer 250 is optional.

As depicted in FIG. 2(i), mating bond pads on the two device layers are aligned and bonded together to form metal bonds 274 and 275, preferably by thermal compression bonding. The overall thickness of bonds 274 and 275 determines the vertical spacing between the stationary and moveable actuator structures. If employed, handle substrate 260 and etch stop layer 250 are removed, preferably by etching (in two steps), to yield the structure depicted in FIG. 2(j). Small areas on device layer 140 are patterned and removed, preferably by etching, to expose at least two alignment marks on preserved portions (not shown) of device layer 130 in FIG. 2(a).

As depicted in FIG. 2(k), device layer 140 is patterned with pattern layer 280, which is aligned via the alignment marks on device layer 130 so as to provide precise alignment relative to the comb teeth of actuator structures 131 and 132. Pattern layer 280 is typically comprised of photoresist but could be a different type of mask.

As depicted in FIG. 2(l), device layer 140 is etched to form a moveable structure comprising micromirror 141, moveable comb structure 142 and silicon spring 143, as well as stationary silicon pads 144 and 145. Spring 143 (depicted as a shaded area since it is not in the same cross-sectional plane) is connected to pads 144 and 145, which are attached via metal bonds 274 and 275 to pads 204 and 205 on support structures 135 and 136, respectively, on first silicon device layer 130. Insulating layer 120 electrically isolates the various structures disposed thereon. The etching procedure for device layer 140 also provides access to electrical contact pads 133 and 134. Electrical contact to pads 133 and 134 and one of pads 144 or 145 is typically provided by standard wire bonding.

The description above utilized fabrication of a micromirror device having a comb actuator with the moveable teeth connected to a torsion spring as an example. As would be evident to those skilled in the art, however, the process of the present invention can be used to fabricate a wide variety MEMS devices and device configurations. For example, the fabricated micromirror device could have the moveable teeth connected to opposing sides of the mirror instead of to the torsion spring. In another micromirror configuration, four silicon springs attached to the corners of a rectangular mirror could replace the torsion spring arrangement to provide linear rather than rotational mirror motion. The present invention is particularly useful for fabrication of active MEMS devices, including but not limited to scanning micromirrors, electrical and optical switches, variable capacitors and inductors, and high frequency resonators. Active MEMS devices typically use an electrostatic comb actuator but the present invention could also be used to fabricate devices employing other types of actuators. The present invention may also be used to fabricate sensor devices, including but not limited to accelerometers, tilt sensors, gyroscopes, pressure sensors and magnetometers. In addition, the process of the present invention may also be used to fabricate MEMS devices having device layers of materials other than silicon (germanium, for example).

As those skilled in the art will appreciate, some of the steps in the process of the present invention can be performed in a different order without substantially affecting the results. In some embodiments of the invention, steps may also be modified and additional steps may be added or substituted.

Features of the Invention

Key features of the present invention that contribute to high device performance, reduced processing time and high process yield are relatively thin silicon device layers, low-temperature Au—Au thermal compression bonding for inter-layer connections, high precision alignment between device layers, and self release during formation of the moveable device structure.

Thin silicon device layers, enabled by use of a supporting substrate, reduce etch times from 3–5 hours for prior art procedures to 20–30 minutes. In addition to increasing the throughput and reducing costs of the fabrication process, shorter etch times significantly increase the accuracy of the etch process and, by enabling use of thinner photoresist layers, the resolution of the photolithographic process as well. The resolution demonstrated for the present invention is 2 $\mu$m compared to 4 $\mu$m or larger for prior art processes. High resolution and high precision for the device actuator structures enables high device performance.

The relatively low temperature for the metal-metal thermal compression bonding of the present invention (330° C. compared to 1100° C. for silicon-oxide-silicon bonding) minimizes stress and deformation of the actuator structures so as to further improve device performance. The Au—Au bonding procedure is also less sensitive to particulates, which enable bonding to be performed in a relatively inexpensive cleanroom (Class 1000, for example). In addition, metal-metal bonding ensures that all structures other than the drive voltage contacts are properly connected and grounded, avoiding extra processing steps sometimes required for prior art processes.

The present invention enables high precision alignment between device layers via use of alignment marks on the first device layer (exposed by etching away local areas of the second device layer).

The self release provided by the present invention avoids the wet chemical oxide etch (BF or BOE), which is a primary cause of reduced device yield for prior art processes.

Devices made by the process of the present invention are always protected by the supporting substrate, whereas those fabricated by prior art processes are subject to damage during handling and packaging, and especially upon inversion of the wafer for photolithography and etching of the backside.

Fabrication of a Preferred Embodiment

This process was used to fabricate MEMS scanning micromirror devices having square mirrors (200–500 $\mu$m square) with moveable comb actuator teeth (20–100 $\mu$m long, 2–5 $\mu$m wide and 1–5 $\mu$m spacing) on two opposing sides and torsion springs (1.5–5 $\mu$m wide and 100–1000 $\mu$m long) at the midpoints of the other two sides. Alignment marks were etched into the surface of a first silicon device layer (50–200 $\mu$m thick) on a first SOI wafer having a silicon oxide internal etch stop layer and a silicon supporting substrate (300–500 $\mu$m thick). A silicon oxide etch resistant layer (2500 Å thick) was applied by PECVD to the first silicon device layer and was patterned and etched to expose silicon contact pads (50–200 $\mu$m square), which were selectively metallized by vacuum evaporation of 150 Å Cr and 5000 Å Au, and liftoff of the remaining photoresist and extraneous metal. The etch resistant layer was then patterned again and the patterned oxide was removed by dry oxide plasma etching. This was followed by deep silicon plasma etching of the underlying silicon to form the stationary comb structure. The same Cr/Au metallization on the first silicon layer on the first wafer was applied to matching areas on a second silicon device layer (20-µm thick) on a second wafer having a silicon oxide internal etch stop layer and a silicon handle substrate (300–500 µm thick). The matching Cr/Au contacts on the two wafers were aligned and bonded together by thermal compression bonding (330° C. for one hour) and the silicon handle substrate and oxide etch stop layer on the second wafer were etched away (after lapping). Small areas (5000 µm square) on the second silicon layer were etched away to expose two alignment marks on the first silicon layer, which were used for precise alignment of the mask for patterning the second silicon layer. The second silicon layer was patterned and etched to form the moveable comb structure, micromirror, torsion spring and anchor/contact pads, and to expose the contact pads for the stationary comb. Electrical contacts were formed to the contact pads by gold wire bonding.

The micromirror devices fabricated from wafers according to the process of the present invention provided scanning over a 12° optical range and ±3° mechanical angle at a high resonant frequency of 2.5 kHz with an operating voltage of only 20 VDC. For comparison, similar MEMS scanning micromirror devices with circular mirrors (550 µm diameter) were fabricated according to a prior art process (R. A. Conant, J. T. Lee, N. Y. Lau and R. S. Muller, p. 6, Proc. Solid-State and Actuator Workshop, Hilton Head Island, S.C., Jun. 4–8, 2000) involving a through-wafer deep silicon etch and wet chemical release. Under comparable scanning conditions, mirrors fabricated according to the prior art required an operating voltage in excess of 100 V, which is at least five times that for the present device. The process of the present invention also provided almost 100% yield of good devices.

I claim:

1. A process for fabricating a MEMS device, comprising the steps of:
   providing a first wafer comprised of a first etch stop layer sandwiched between a first device layer and a supporting substrate layer;
   depositing an etch resistant layer on the first device layer;
   depositing a first metal layer on the first device layer in predetermined areas to define first bond pad areas;
   removing the etch resistant layer and at least a portion of the first device layer in predetermined areas to form a stationary part of an actuator;
   providing a second wafer which includes a second device layer;
   depositing a second metal layer on the second device layer in predetermined second bond pad areas patterned to be alignable with the first bond pad areas on the first device layer;
   bonding together the first bond pad areas on the first device layer and the second bond pad areas on the second device layer; and
   removing the second device layer in predetermined areas so as to form a moveable part of the actuator and a moveable functional device element connected via at least one spring to at least one stationary pad, wherein the moveable part of the actuator is aligned relative to the stationary part of the actuator,
   such that an electrical voltage applied between the moveable part of the actuator and the stationary part of the actuator tends to cause the moveable part of the actuator and the moveable functional device element to move relative to the stationary part of the actuator.

2. The process of claim 1, wherein at least one of the device layers is comprised of silicon.

3. The process of claim 1, wherein the first etch stop layer is comprised of silicon oxide.

4. The process of claim 1, wherein the supporting substrate layer is comprised of silicon.

5. The process of claim 1, wherein the etch resistant layer is comprised of an insulator and the step of depositing the first metal layer on the first device layer in predetermined areas further comprises the steps of:
   applying and patterning a photoresist layer on the etch resistant layer;
   selectively removing the etch resistant layer to expose the first device layer in the predetermined areas;
   depositing the first metal layer; and
   lifting off the photoresist layer and metal deposited thereon.

6. The process of claim 5, wherein the insulator is silicon oxide.

7. The process of claim 1, wherein the etch resistant layer comprises a metal and the step of depositing the first metal layer on the first device layer in predetermined areas further comprises the steps of patterning and selectively removing the metal etch resistant layer.

8. The process of claim 1, wherein the step of removing the etch resistant layer further comprises removing by dry oxide plasma etching.

9. The process of claim 1, wherein the step of removing at least a portion of the first device layer in predetermined areas further comprises removing by plasma etching.

10. The process of claim 1, wherein the second wafer further comprises a second etch stop layer sandwiched between the second device layer and a handle substrate.

11. The process of claim 10, wherein the second etch stop layer is comprised of silicon oxide.

12. The process of claim 10, wherein the handle substrate is comprised of silicon.

13. The process of claim 10, further comprising, after the step of bonding, the step of:
   removing the handle substrate and the second etch stop layer from the second device layer.

14. The process of claim 1, wherein at least one of the first and second metal layers comprise a gold layer and an adhesion layer, said adhesion layer being comprised of a metal selected from the group consisting of chromium, titanium, nickel and cobalt.

15. The process of claim 1, wherein the step of bonding together the first bond pad areas and the second bond pad areas further comprises thermal compression bonding.

16. A process for fabricating a MEMS device, comprising the steps of:
   providing a first wafer comprised of a first silicon oxide etch stop layer sandwiched between a first silicon device layer and a supporting substrate layer;
   depositing an etch resistant layer on the first silicon device layer;
   depositing a first metal layer on the first silicon device layer in predetermined areas to define first bond pad areas;
   removing the etch resistant layer and at least a portion of the first silicon device layer in predetermined areas to form a stationary part of an actuator;
   providing a second wafer which includes a second silicon device layer;

depositing a second metal layer on the second silicon device layer in predetermined second bond pad areas patterned to be alignable with the first bond pad areas on the first silicon device layer;

bonding together the first bond pad areas on the first silicon device layer and the second bond pad areas on the second silicon device layer; and removing the second silicon device layer in predetermined areas so as to form a moveable part of the actuator and a moveable functional device element connected via at least one silicon spring to at least one stationary silicon pad, wherein the moveable part of the actuator is aligned relative to the stationary part of the actuator, such that an electrical voltage applied between the moveable part of the actuator and the stationary part of the actuator tends to cause the moveable part of the actuator and the moveable functional device element to move relative to the stationary part of the actuator.

17. The process of claim 16, wherein the supporting substrate layer is comprised of silicon.

18. The process of claim 16, wherein the etch resistant layer comprises silicon oxide and the step of depositing the first metal layer on the first silicon device layer in predetermined areas further comprises the steps of:

applying and patterning a photoresist layer on the etch resistant layer;

selectively removing the etch resistant layer to expose the first silicon device layer in the predetermined areas;

depositing the first metal layer; and lifting off the photoresist layer and metal deposited thereon.

19. The process of claim 16, wherein the etch resistant layer comprises a metal and the step of depositing the first metal layer on the first device layer in predetermined areas further comprises the steps of patterning and selectively removing the metal etch resistant layer.

20. The process of claim 16, wherein the step of removing the etch resistant layer further comprises removing by dry oxide plasma etching.

21. The process of claim 16, wherein the step of removing at least a portion of the first device layer in predetermined areas further comprises removing by deep silicon plasma etching.

22. The process of claim 16, wherein the second wafer further comprises a second silicon oxide etch stop layer sandwiched between the second silicon device layer and a silicon handle substrate.

23. The process of claim 22, further comprising, after the step of bonding, the step of:

removing the handle substrate and the second etch stop layer from the second device layer.

24. The process of claim 16, wherein at least one of the first and second metal layers comprise a gold layer and an adhesion layer, said adhesion layer being comprised of a metal selected from the group consisting of chromium, titanium, nickel and cobalt.

25. The process of claim 16, wherein the step of bonding together the first bond pad areas and the second bond pad areas further comprises thermal compression bonding.

26. A process for fabricating a MEMS device, comprising the steps of:

providing a first wafer comprised of a first silicon oxide etch stop layer sandwiched between a first silicon device layer and a silicon supporting substrate layer;

depositing a silicon oxide etch resistant layer on the first silicon device layer;

depositing a first metal layer on the first silicon device layer in predetermined areas to define first bond pad areas;

removing the silicon oxide etch resistant layer and at least a portion of the first silicon device layer in predetermined areas to form a stationary part of an actuator;

providing a second wafer comprised of a second silicon oxide etch stop layer sandwiched between a second silicon device layer and a silicon handle substrate;

depositing a second metal layer on the second silicon device layer in predetermined second bond pad areas patterned to be alignable with the first bond pad areas on the first silicon device layer;

bonding together the first bond pad areas on the first silicon device layer and the second bond pad areas on the second silicon device layer by thermal compression bonding;

removing the handle substrate and the second etch stop layer from the second device layer; and removing the second silicon device layer in predetermined areas so as to form a moveable part of the actuator and a moveable functional device element connected via at least one silicon spring to at least one stationary silicon pad, wherein the moveable part of the actuator is aligned relative to the stationary part of the actuator, such that an electrical voltage applied between the moveable part of the actuator and the stationary part of the actuator tends to cause the moveable part of the actuator and the moveable functional device element to move relative to the stationary part of the actuator.

27. The process of claim 26, wherein the step of depositing the first metal layer on the first silicon device layer in predetermined areas comprises the steps of:

applying and patterning a photoresist layer on the etch resistant layer;

selectively removing the etch resistant layer to expose the first silicon device layer in the predetermined areas;

depositing the first metal layer; and lifting off the photoresist layer and metal deposited thereon.

28. The process of claim 26, wherein at least one of the first and second metal layers comprise a gold layer and an adhesion layer, said adhesion layer being comprised of a metal selected from the group consisting of chromium, titanium, nickel and cobalt.

29. A process for fabricating a MEMS micromirror device, comprising the steps of:

providing a first wafer comprised of a first silicon oxide etch stop layer sandwiched between a first silicon device layer and a silicon supporting substrate layer;

depositing a silicon oxide etch resistant layer on the first silicon device layer;

depositing a first metal layer on the first silicon device layer in predetermined areas to define first bond pad areas;

removing the silicon oxide etch resistant layer and at least a portion of the first silicon device layer in predetermined areas to form a stationary part of a comb actuator;

providing a second wafer comprised of a second silicon oxide etch stop layer sandwiched between a second silicon device layer and a silicon handle substrate;

depositing a second metal layer on the second silicon device layer in predetermined second bond pad areas patterned to be alignable with the first bond pad areas on the first silicon device layer;

bonding together the first metal layer on the first bond pad areas on the first silicon device layer and the second metal layer on the second bond pad areas on the second silicon device layer by thermal compression bonding;

removing the handle substrate and the second etch stop layer from the second device layer; and removing the second silicon device layer in predetermined areas so as to form a moveable part of the comb actuator and a moveable micromirror connected via at least one silicon spring to at least one stationary silicon pad, wherein the moveable part of the comb actuator is aligned relative to the stationary part of the comb actuator, such that an electrical voltage applied between the moveable part of the comb actuator and the stationary part of the comb actuator tends to cause the moveable part of the comb actuator and the moveable micromirror to move relative to the stationary part of the comb actuator.

30. The process of claim 29, wherein at least one of the first and second metal layers comprise a gold layer and an adhesion layer, said adhesion layer being comprised of a metal selected from the group consisting of chromium, titanium, nickel and cobalt.

* * * * *